(12) United States Patent
Lin et al.

(10) Patent No.: US 8,492,180 B2
(45) Date of Patent: Jul. 23, 2013

(54) LED AND METHOD FOR MANUFACTURING THE SAME

(75) Inventors: Hsin-Chiang Lin, Hsinchu (TW); Pin-Chuan Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/330,688

(22) Filed: Dec. 20, 2011

(65) Prior Publication Data
US 2013/0015490 A1     Jan. 17, 2013

(30) Foreign Application Priority Data
Jul. 15, 2011    (CN) .......................... 2011 1 0198444

(51) Int. Cl.
*H01L 21/00* (2006.01)
(52) U.S. Cl.
USPC ............................................. 438/26; 257/99
(58) Field of Classification Search
CPC  H01L 33/44; H01L 33/46; H01L 33/48; H01L 33/54; H01L 33/58; H01L 33/60
USPC ................................................ 257/99; 438/26
See application file for complete search history.

(56) References Cited

U.S. PATENT DOCUMENTS

| | | | |
|---|---|---|---|
| 2008/0054287 A1* | 3/2008 | Oshio et al. | 257/99 |
| 2010/0176417 A1* | 7/2010 | Wang | 257/99 |
| 2011/0227113 A1* | 9/2011 | Chien et al. | 257/98 |

* cited by examiner

*Primary Examiner* — N Drew Richards
*Assistant Examiner* — Ratisha Mehta
(74) *Attorney, Agent, or Firm* — Altis Law Group, Inc.

(57) ABSTRACT

An LED includes a base, a pair of leads fixed on the base, a housing fixed on the leads, a chip mounted on one lead and an encapsulant sealing the chip. The housing defines a cavity in a central area thereof and a chamber adjacent to a circumferential periphery thereof. Top faces of the leads are exposed in the chamber. A blocking wall is formed in the chamber to contact the exposed top faces of the leads. A bonding force between the blocking wall and the leads is larger than that between the leads and the housing. A method for manufacturing the LED is also disclosed.

8 Claims, 8 Drawing Sheets

LED AND METHOD FOR MANUFACTURING THE SAME

CROSS-REFERENCE TO RELATED APPLICATION

This patent application is related to U.S. patent application Ser. No. 13/330,704, entitled "LED AND METHOD FOR MANUFACTURING THE SAME", assigned to the same assignee, and disclosure of which is incorporated herein by reference in its entirety.

BACKGROUND

1. Technical Field

The present disclosure relates to LEDs (light emitting diodes) and methods for manufacturing the LEDs, and more particularly, to an LED having a good waterproof capability and a method for manufacturing the LED.

2. Description of Related Art

As a new type of light source, LEDs are widely used in various applications. A typical LED includes a base, a pair of metal leads fixed on the base, a housing formed on the leads, a light emitting chip fixed in the housing and electrically connected to the leads via wires, and an encapsulant attached on the housing and sealing the light emitting chip. The housing is often formed by molding a material of PPA (polyphthalamide) on the two metal leads. However, the attachment between the housing and the leads is unreliable due to poor adherent capability of PPA to metal. Therefore, moisture of the outside environment may enter the LED through an interface between the leads and the housing, causing malfunction of the light emitting chip.

What is needed, therefore, is an LED and a method for manufacturing the LED which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Figure 1:
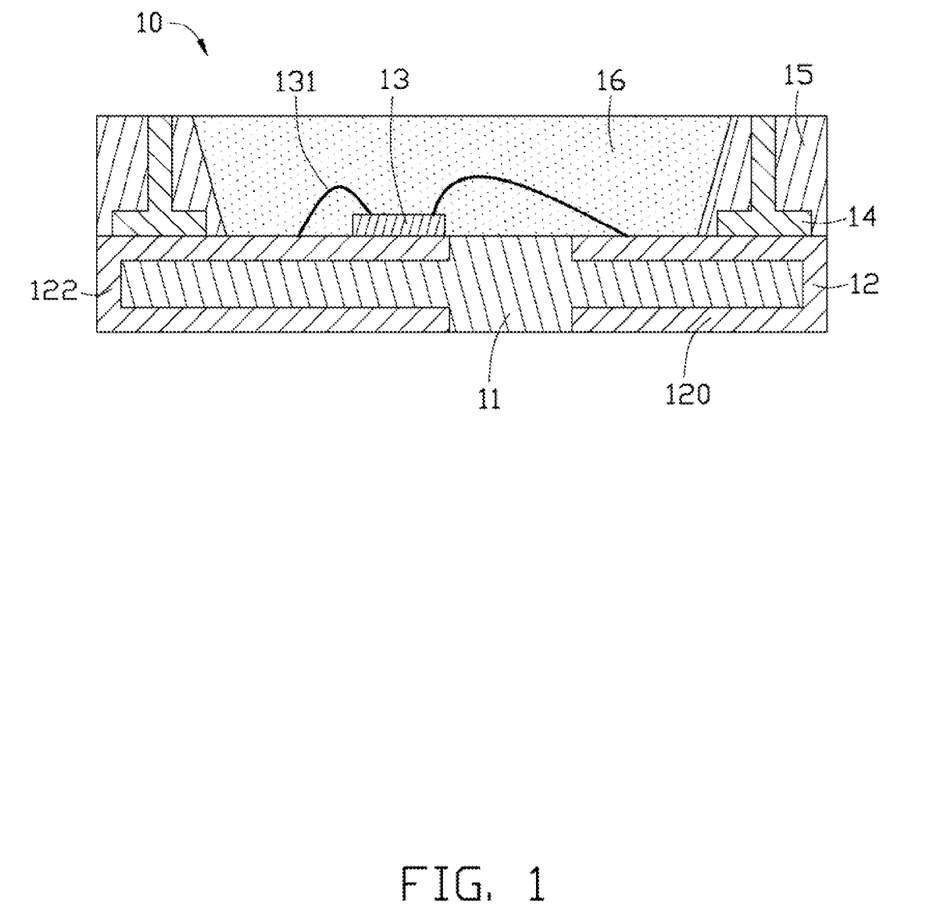
FIG. 1 shows an LED in accordance with a first embodiment of the present disclosure.

Referring to FIG. 1, an LED (light emitting diode) 10 in accordance with a first embodiment of the present disclosure is shown. The LED 10 includes a base 11, a pair of leads 12 fixed on the base 11, a housing 15 secured on the leads 12, a light emitting chip 13 received in the housing 15 and electrically connected to the pair of leads 12 and an encapsulant 16 sealing the chip 13.

The base 11 may be made of plastic such as PPA (polyphthalamide). The base 11 may have a rectangular shape. The leads 12 are made of metal such as copper or aluminum. The two leads 12 are spaced from each other. Each of the leads 12 includes a pair of horizontal sections 120 and a vertical section 122 interconnecting the two horizontal sections 120.

Figure 2:
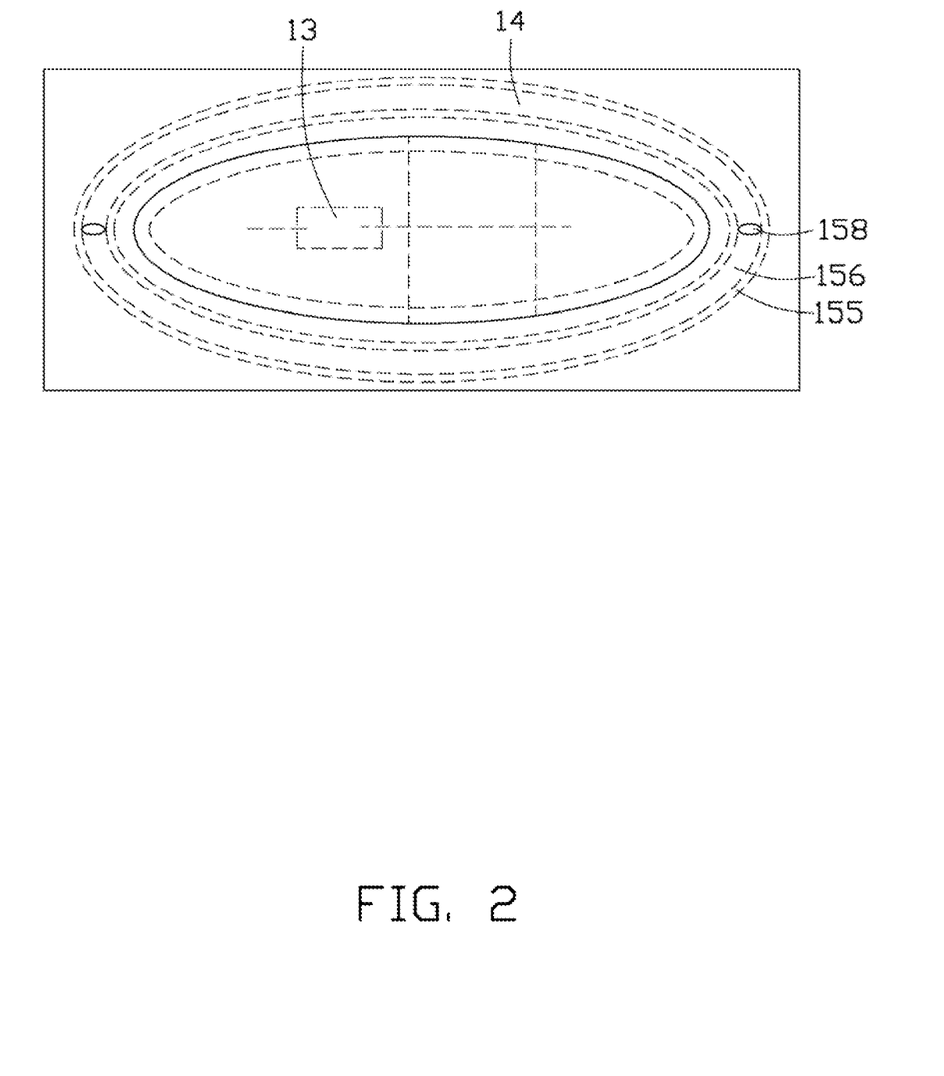
FIG. 2 is a top view of the LED of FIG. 1.
Figure 3:
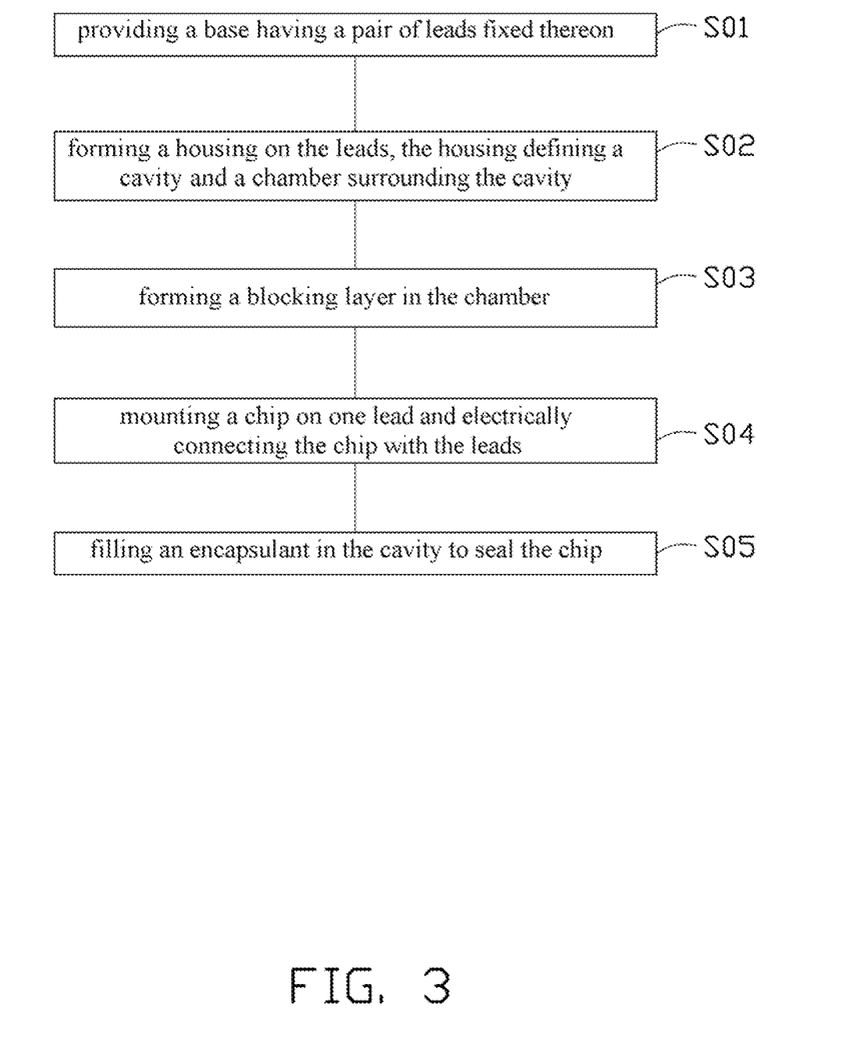
FIG. 3 is a block diagram showing manufacturing processes of the LED of FIG. 1.
Figure 5:
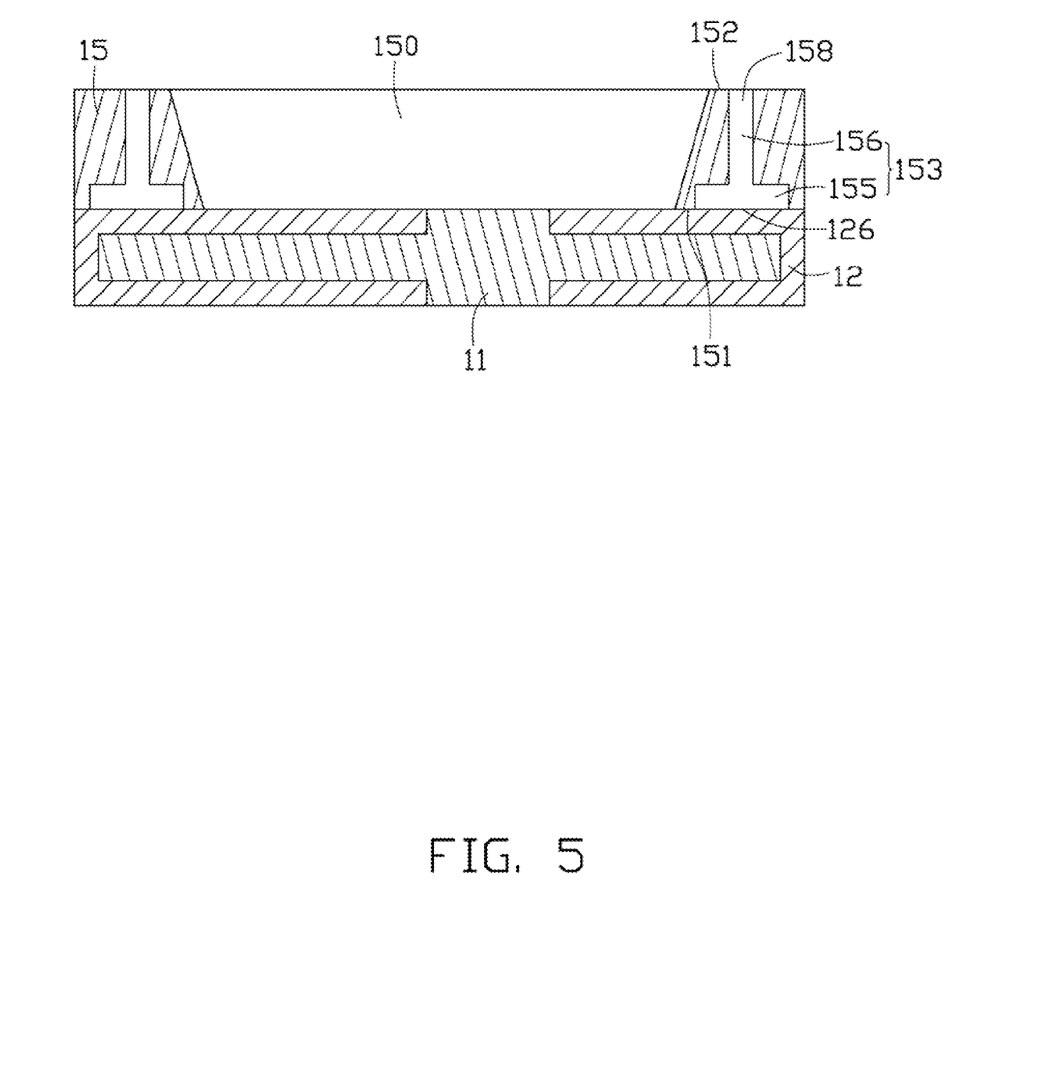
FIG. 5 shows a second process of manufacturing the LED of FIG. 1.
Figure 6:
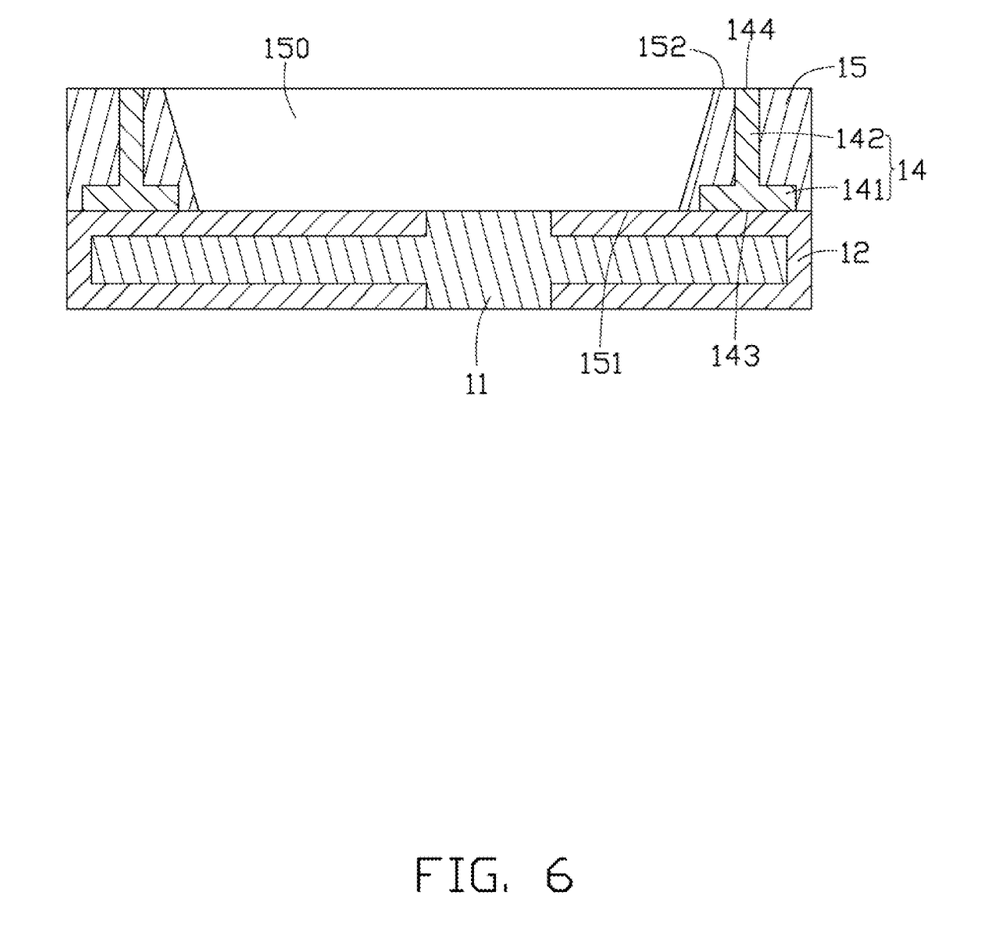
FIG. 6 shows a third process of manufacturing the LED of FIG. 1.

Also referring to FIGS. 2 and 5-6, the housing 15 is formed on the leads 12 by injection-molding, transfer-molding or other suitable methods. The housing 15 may also be made of PPA. The housing 15 defines a cavity 150 extending from a bottom face 151 to a top face 152 thereof to expose top faces of the leads 12. The housing 15 further defines a chamber 153 surrounding the cavity 150. The chamber 153 is spaced from the cavity 150. The chamber 153 includes an upper groove 156 and a lower groove 155 communicating with the upper groove 156. The upper groove 156 has a width less than that of the lower groove 155, and a height larger than that of the lower groove 155. The lower groove 155 extends through the bottom face 151 of the housing 15. The upper groove 156 is located beneath the top face 152 of the housing 15 and communicates with an outside of the LED 10 through two holes 158 (see FIG. 2) extending through the top face 152 of the housing 15 into the upper groove 156. A blocking wall 14 is formed by filling blocking material in the chamber 153 through the two holes 158. The blocking wall 14 may be made of epoxy or silicon. The blocking wall 14 includes an upper portion 142 filled in the upper groove 156 and a lower portion 141 filled in the lower groove 155. The lower portion 141 has a bottom face 143 (see FIG. 6) joining the top faces 126 of the leads 12, and a top face 144 of the upper portion 142 is flush with the top face 152 of the housing 15. The blocking wall 14 surrounds the chip 14. Furthermore, the blocking wall 14 extends over a width and a length of each of the leads 12. Since the blocking wall 14 is made of epoxy or silicon and thus has a bonding force with the metal leads 12 which larger than that of the housing 15 made of PPA with the metal leads 12, outside moisture entering the LED 10 through an interface between the bottom face 151 of housing 15 and the top faces 126 of the leads 12 would be effectively blocked by the blocking wall 14. Thus, safety and performance of the chip 13 received in the cavity 150 are ensured.

The chip 13 is fixed on one of the two leads 12 by silver epoxy gluing, eutectic bonding or other methods. The chip 13 may be a GaN chip, an InGaN chip, an AlInGaN chip or other light emitting semiconductor chips. The chip 13 is electrically connected to the two leads 12 via wire bonding of two wires 131. The encapsulant 16 is filled in the cavity 150 to seal the chip 13 and the wires 131. The encapsulant 16 may be made of epoxy, silicon or other transparent materials. Fluorescent material such as YAG (yttrium aluminum garnet), TAB (terbium aluminum garnet), phosphide or sulfide can be uniformly distributed in the encapsulant 16 to covert the color of light from the chip 13 to a desired color.

A method for manufacturing the LED 10 is also disclosed. The method mainly includes multiple steps from S01 to S05 as follows.

Figure 4:
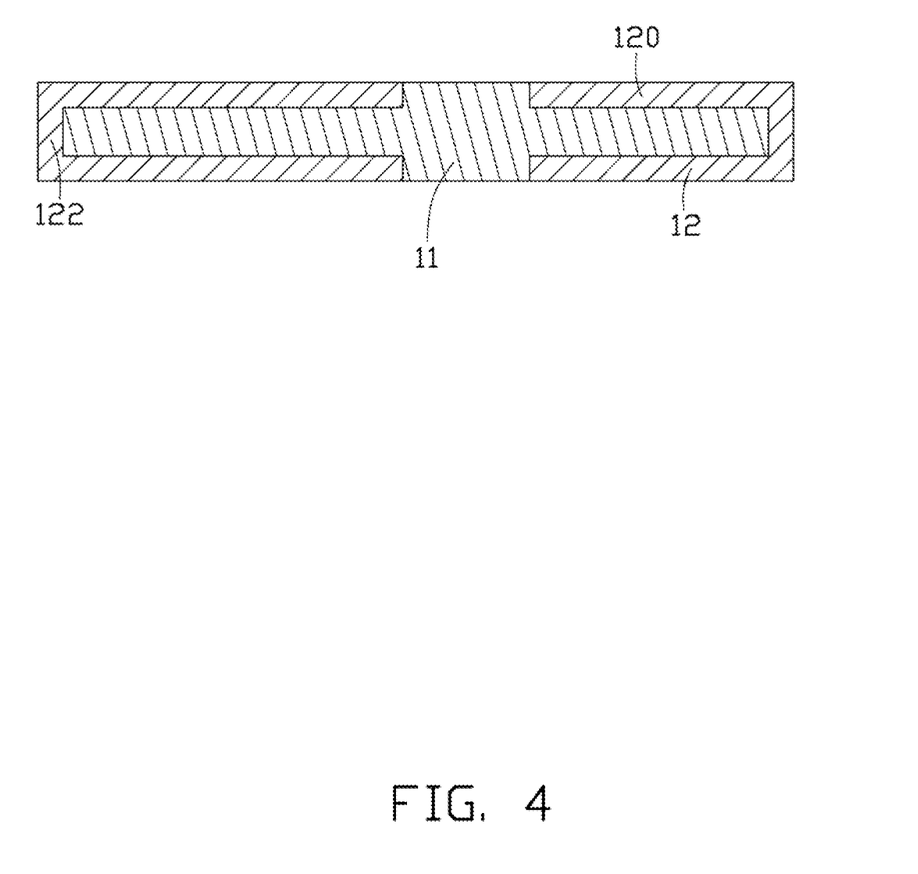
FIG. 4 shows a first process of manufacturing the LED of FIG. 1.

First, as shown in FIG. 4, a base 11 having a pair of leads 12 fixed thereon is provided. The base 11 may be molded to the pair of leads 12 via injection-molding, transfer-molding or other suitable methods.

As shown in FIG. 5, a housing 15 is then molded on the pair of leads 12 by injection-molding, transfer-molding or other suitable methods. The housing 15 defines a cavity 150 in a central area thereof and a chamber 153 surrounding the cavity 150. The cavity 150 may be formed during the molding of the housing 15 on the leads 12. The chamber 153 may be formed by firstly forming a wall made of photoresist and having a shape the same as that of the chamber 153 prior to molding the housing 15 onto the leads 12. After the molding of the housing 15 on the leads 12, the wall made of photoresist is accommodated in the housing 15. The wall is removed by dipping the housing 15 together with the leads 12 and the base 11 into a chemical solution, wherein the wall is dissolved to thereby form the chamber 153 in the housing 15. That is to say, the chamber 153 is formed after the cavity 150 has been formed.

Figure 7:
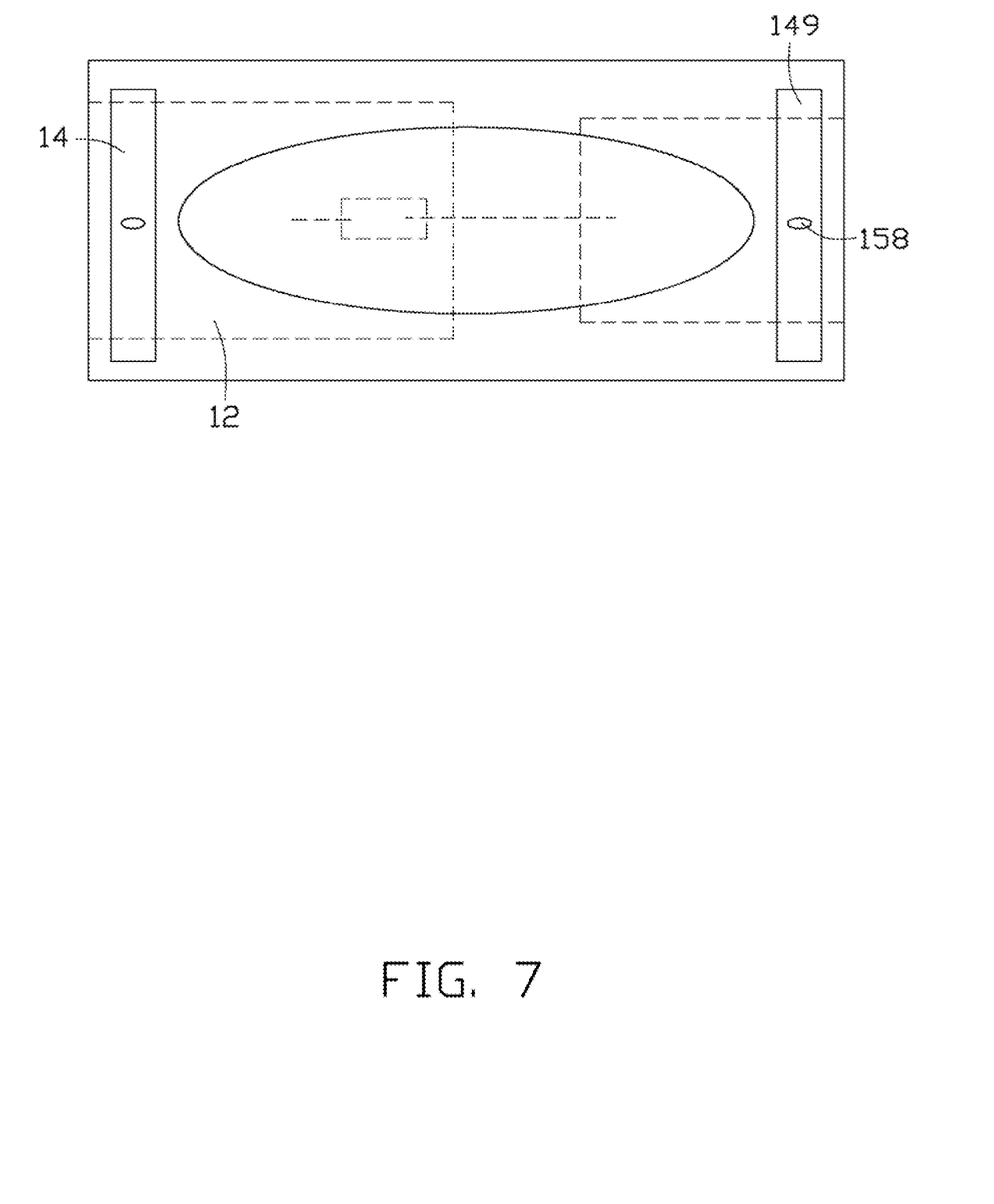
FIG. 7 is a top view showing a semi-finished product in a third process of manufacturing an LED in accordance with a second embodiment of the present disclosure.

As shown in FIG. 6, a blocking wall 14 is further formed in the chamber 153 by injection-molding blocking material such as epoxy or silicon in the chamber 153 through the two holes 158. The blocking wall 14 substantially fills the chamber 153 to connect the top faces 126 of the leads 12. In this embodiment, the blocking wall 14 is annular and surrounds the cavity 150. However, as shown in FIG. 7, the shape of the chamber 153 may vary to two separate parts so that the blocking wall 14 filling in the chamber 153 is also changed to two separate parts 149 respectively fixed to the two leads 12. Each part 149 of the blocking wall 14 has a length larger than a width of a corresponding lead 12, whereby the interfaces between the bottom face 151 of housing 15 and the top faces 126 of the leads 12, are substantially blocked and sealed from the outside moisture. The two separate parts 149 of the blocking wall 14 are parallel to each other.

Figure 8:
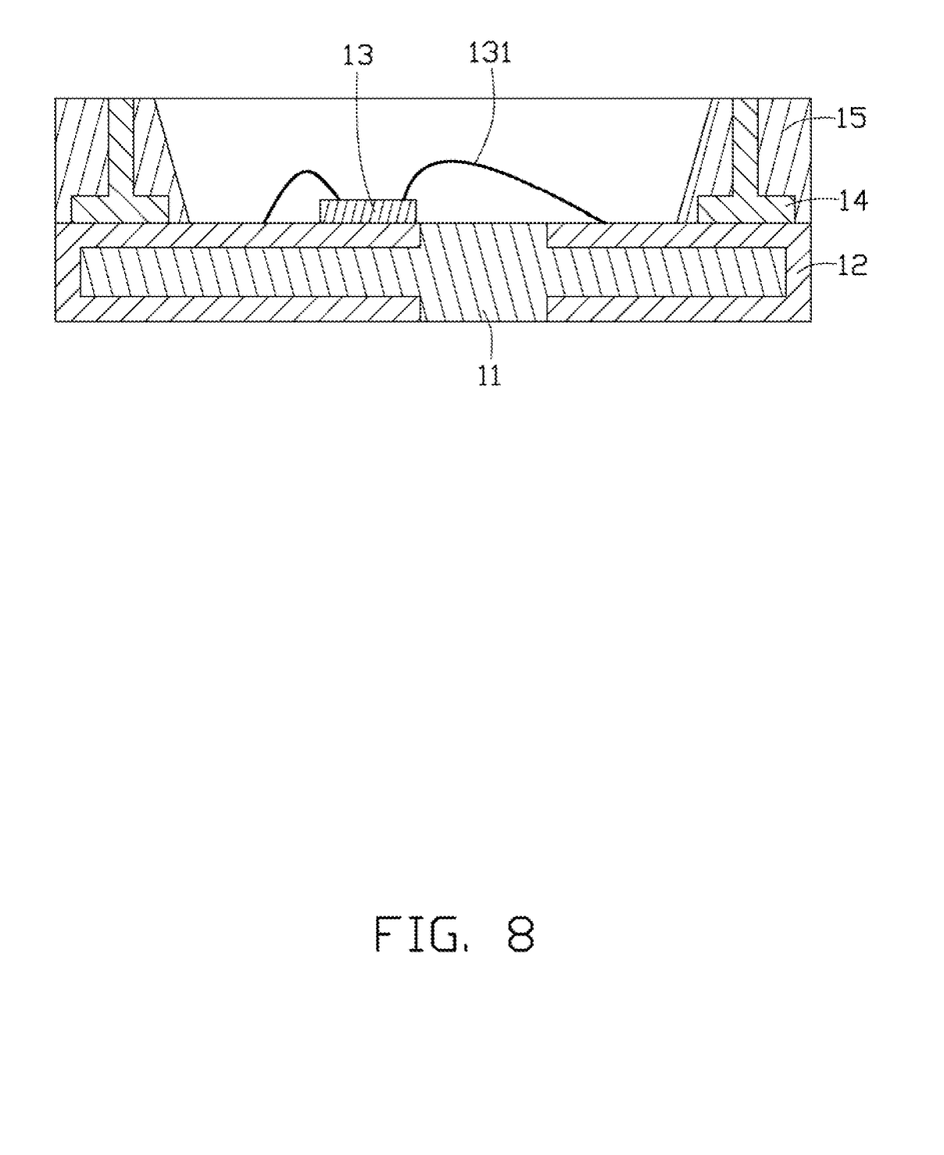
FIG. 8 shows a fourth process of manufacturing the LED of FIG. 1.

As shown in FIG. 8, a chip 13 is fixed on one of the leads 12 via silver epoxy gluing, eutectic bonding or other methods. Two wires 131 electrically connect the chip 13 to the top faces 126 of the leads 12.

Finally, an encapsulant 16 is filled into the cavity 150 to seal the chip 13 in the cavity 150 as shown in FIG. 1. Therefore, the manufacture of the LED 10 is completed.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A method for manufacturing an LED (light emitting diode) comprising:
    providing a pair of leads;
    forming a housing on the leads, the housing defining a cavity in a central area thereof and a chamber adjacent to an outer periphery thereof, top faces of the leads being exposed within the chamber;
    forming a blocking wall in the chamber, the blocking wall connecting the top faces of the leads, and a bonding force between the blocking wall and the leads being larger than that between the housing and the leads;
    fixing a chip in the cavity and electrically connecting the chip to the two leads after forming the blocking wall; and
    sealing the chip with an encapsulant filled in the cavity.

2. The method of claim 1, wherein the chamber is formed later than the formation of the cavity.

3. The method of claim 1, wherein the chamber comprises a lower groove and an upper groove communicating with the lower groove, a top of the upper groove being located lower than a top face of the housing and communicating with an outside of the housing through a hole defined in the top face of the housing.

4. The method of claim 3, wherein the blocking wall is formed by injecting epoxy or silicon into the chamber through the hole.

5. The method of claim 3, wherein the lower groove has a width larger than that of the upper groove and a height less than that of the upper groove.

6. The method of claim 1, wherein the blocking wall is continuous and annular, the blocking wall surrounding the encapsulant and being separated from the encapsulant.

7. The method of claim 1, wherein the blocking wall comprises two separate parts fixed on the two leads, respectively, each part of the blocking wall having a length larger than a width of a corresponding lead.

8. The method of claim 1, wherein the housing is formed by molding polyphthalamide onto the leads.

* * * * *